(12) United States Patent
Bour et al.

(10) Patent No.: US 7,674,352 B2
(45) Date of Patent: Mar. 9, 2010

(54) SYSTEM AND METHOD FOR DEPOSITING A GASEOUS MIXTURE ONTO A SUBSTRATE SURFACE USING A SHOWERHEAD APPARATUS

(75) Inventors: David Bour, Cupertino, CA (US); Lori Washington, Union City, CA (US); Sandeep Nijhawan, Los Altos, CA (US); Ronald Stevens, San Ramon, CA (US); Jacob Smith, Santa Clara, CA (US); Alexander Tam, Union City, CA (US); Nyi Oo Myo, Campbell, CA (US); Steve Park, Cupertino, CA (US); Rosemary Twist, San Jose, CA (US); Garry Kwong, San Jose, CA (US); Jie Su, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 185 days.

(21) Appl. No.: 11/564,198

(22) Filed: Nov. 28, 2006

(65) Prior Publication Data

US 2008/0124463 A1 May 29, 2008

(51) Int. Cl.
*C23F 1/00* (2006.01)
*H01L 21/306* (2006.01)

(52) U.S. Cl. .................................. 156/345.34

(58) Field of Classification Search ............. 156/345.34
See application file for complete search history.

(56) References Cited

U.S. PATENT DOCUMENTS

| 5,595,606 | A * | 1/1997 | Fujikawa et al. | 118/725 |
| 2002/0092471 | A1 * | 7/2002 | Kang et al. | 118/715 |
| 2005/0173569 | A1 | 8/2005 | Noorbakhsh et al. | |
| 2005/0255257 | A1 * | 11/2005 | Choi et al. | 427/585 |
| 2006/0263522 | A1 | 11/2006 | Byun | |

* cited by examiner

*Primary Examiner*—Ram N Kackar
*Assistant Examiner*—Keath T Chen
(74) *Attorney, Agent, or Firm*—Townsend and Townsend and Crew, LLP

(57) ABSTRACT

A gaseous mixture is deposited onto a substrate surface using a showerhead. A first plenum of the showerhead has a plurality of channels fluidically coupled with an interior of a processing chamber. A second plenum gas flows through a plurality of tubes extending from a second plenum of the showerhead through the channels into the interior of the processing chamber. The diameter of the tubes is smaller than the diameter of the channels such that a first plenum gas flows into the interior of the processing chamber through a space defined between the outer surface of the tubes and the surface of the channels. The length and diameter of the tubes determine the level of distribution and the molar ratio of the first gas and the second gas in the gaseous mixture that is deposited on the surface of the substrate.

5 Claims, 9 Drawing Sheets

US 7,674,352 B2

SYSTEM AND METHOD FOR DEPOSITING A GASEOUS MIXTURE ONTO A SUBSTRATE SURFACE USING A SHOWERHEAD APPARATUS

BACKGROUND OF THE INVENTION

Semiconductor wafer processing systems generally contain a process chamber having a pedestal for supporting a semiconductor wafer within the chamber proximate a processing region. The chamber forms a vacuum enclosure defining, in part, the process region. A gas distribution assembly or showerhead provides one or more process gases to the process region. The gases are then heated and/or supplied energy to form a plasma which performs certain processes upon the wafer. These processes may include chemical vapor deposition (CVD) to deposit a film upon the wafer or an etch reaction to remove material from the wafer.

In processes that require multiple gases, generally the gases are combined within a mixing chamber that is then coupled to the showerhead via a conduit. For example, in titanium nitride deposition using titanium tetrachloride ($TiCl_4$) and ammonia ($NH_3$) as process gases, the two process gases are supplied to a mixing chamber along with respective carrier gases of helium and hydrogen where they are combined to form a gaseous mixture. The gaseous mixture is then coupled through a conduit to a distribution plate, where the plate contains a plurality of holes such that the gaseous mixture is evenly distributed into the process region. As the gaseous mixture enters the process region and is infused with energy, a chemical reaction occurs between the titanium tetrachloride and the ammonia such that the titanium tetrachloride chemically reacts with the ammonia (i.e., the $TiCl_4$ is reduced by the $NH_3$) to produce titanium nitride. The titanium nitride is deposited on the wafer in a chemical vapor deposition reaction.

Other two gas chemical vapor deposition reactions include the thermal decomposition of tetradiethylaminotitanium (TDEAT) in combination with ammonia to produce titanium nitride, the thermal decomposition of tetradimethylaminotitanium (TDMAT) in combination with ammonia or a nitrogen-hydrogen mixture to produce titanium nitride, or a reduction of tungsten hexafluoride ($WF_6$) using hydrogen ($H_2$) to produce tungsten. In any of these cases and any others that require two or more gases to process a wafer, multiple gases need be uniformly supplied to the process region.

Although it is generally advantageous to mix the gases prior to release into the process region to ensure that the gases are uniformly distributed into the process region, the gases tend to begin reduction, or otherwise react, within the mixing chamber. Consequently, deposition or etching of the mixing chamber, conduits and other chamber components may result prior to the gaseous mixture reaching the process region. Additionally, reaction by products may accumulate in the chamber gas delivery components. In some cases, it is desirable to dispense the gases into the processing region such that the gases are not uniformly distributed in the gaseous mixture.

Therefore, there is a need in the art for a showerhead that provides at least two gases to the process region without commingling the gases prior to reaching the process region, and that affords control over the molar ratio and the level of distribution of gases that interact in the process region.

SUMMARY OF THE INVENTION

According to the present invention, techniques related to the field of substrate processing equipment are provided. More particularly, the present invention relates to a system and method for depositing a gaseous mixture onto a substrate surface using a CVD showerhead. Merely by way of example, the system and method of the present invention are used to control the molar ratio and level of distribution of gases in the gaseous mixture that is deposited onto a surface of a substrate. The system and method can be applied to other processes for semiconductor substrates, for example those used in the formation of integrated circuits.

Embodiments of the invention provide systems for depositing a gaseous mixture onto a substrate surface using a showerhead. Each of the various embodiments include a housing defining a processing chamber, a substrate holder disposed within the processing chamber, a first gas source, and a second gas source. The system also includes a CVD showerhead disposed over the substrate holder. The showerhead comprises a first plenum fluidicly coupled with the first gas source. The first plenum has a plurality of channels fluidicly coupled with an interior of the processing chamber. The CVD showerhead also comprises a second plenum fluidicly coupled with the second gas source. The CVD showerhead further comprises a plurality of tubes extending from the second plenum through the channels and into the interior of the processing chamber. The diameter of the tubes is smaller than the diameter of the channels such that the second gas flows into the interior of the processing chamber through the tubes and the first gas flows into the interior of the processing chamber through the space defined between the outer surface of the tubes and the surface of the channels.

In one embodiment, the length of the tubes extending into the interior of the processing chamber determines the level of distribution of the first gas and the second gas in the gaseous mixture that is deposited on the surface of the substrate positioned on the substrate holder.

In another embodiment, the diameter of the tubes extending into the interior of the processing chamber determines the molar ratio of the first gas and the second gas in the gaseous mixture that is deposited on the surface of the substrate positioned on the substrate holder.

Another embodiment of the invention provides a method for depositing a gaseous mixture onto a substrate surface using a CVD showerhead. The showerhead is positioned in an interior of a processing chamber. A first gas is dispensed from a first gas plenum in the showerhead into the interior of the processing chamber through channels defined in a housing of the showerhead such that the first plenum is fluidicly coupled to the interior of the processing chamber. A second gas is dispensed from a second gas plenum in the showerhead into the interior of the processing chamber through tubes extending from the second gas plenum through the channels. The diameter of the tubes is smaller than the diameter of the channels such that the first gas flows into the interior of the processing chamber through the space defined between the outer surface of the tubes and the surface of the first channels. The gaseous mixture is formed by mixing the first gas and the second gas in the interior of the processing chamber. The gaseous mixture is then deposited onto the surface of the substrate.

In one embodiment, the length of the tubes extending into the interior of the processing chamber determines the level of distribution of the first gas and the second gas in the gaseous mixture.

In another embodiment, the diameter of the tubes extending into the interior of the processing chamber determines the molar ratio of the first gas and the second gas in the gaseous mixture.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

According to the present invention, techniques related to the field of substrate processing equipment are provided. More particularly, the present invention relates to a system and method for depositing a gaseous mixture onto a substrate surface using a CVD showerhead. Merely by way of example, the system and method of the present invention are used to control the molar ratio and level of distribution of gases in the gaseous mixture that is deposited onto a surface of a substrate. The system and method can be applied to other processes for semiconductor substrates, for example those used in the formation of integrated circuits.

Figure 1:
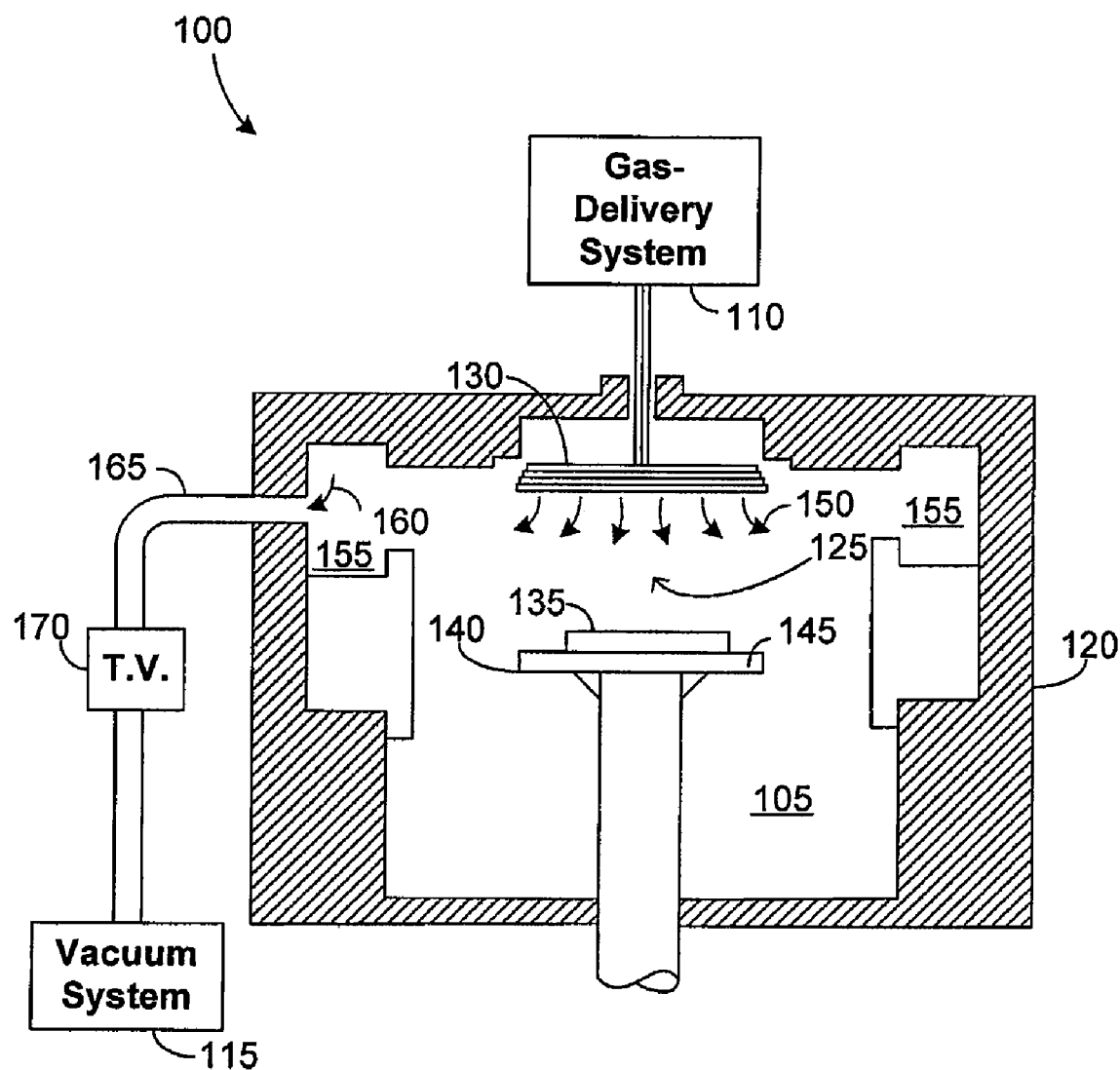
FIG. 1 is a simplified representation of an exemplary CVD apparatus that may be used in implementing certain embodiments of the invention.

FIG. 1 is a simplified diagram of an exemplary chemical vapor deposition ("CVD") system 100, illustrating the basic structure of a chamber in which individual deposition steps can be performed. This system is suitable for performing thermal, sub-atmospheric CVD processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 105 that receives process and other gases from a gas delivery system 110, a vacuum system 115, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 120 that forms vacuum chamber 105 with a gas reaction area 125. A gas distribution structure, such as showerhead 130 (discussed in detail below), disperses reactive gases and other gases, such as purge gases, toward one or more substrates 135 held in position by a substrate support structure 140. Between showerhead 130 and the substrate 135 is gas reaction area 125. Heaters 145 can be controllably moved between different positions to accommodate different deposition processes as well as for an etch or cleaning process. A center board (not shown) includes sensors for providing information on the position of the substrate 135.

Different structures may be used for heaters 145. For instance, some embodiments of the invention advantageously use a pair of plates in close proximity and disposed on opposite sides of the substrate support structure 140 to provide separate heating sources for the opposite sides of one or more substrates 135. Merely by way of example, the plates may comprise graphite or SiC in certain specific embodiments. In another instance, the heaters 140 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 140 exposed to vacuum chamber 105 are made of a ceramic material, such as aluminum oxide ($Al_2O_3$ or alumina) or aluminum nitride. In another embodiment, the heaters 140 comprise lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 110 through supply lines to the showerhead 125. The supply lines deliver gases to the gas distribution structure separately, as described below. Gas delivery system 110 includes a variety of gas sources and appropriate supply lines to deliver a selected amount of each source to chamber 105 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid sources rather than gases. When liquid sources are used, gas delivery system 110 includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the showerhead 130 is vented toward the substrate surface (as indicated by arrows 150), where it may be uniformly distributed radially across the substrate surface in a laminar flow.

Purging gas may be delivered into the vacuum chamber 105 from showerhead 130 and/or from inlet ports or tubes (not shown) through the bottom wall of enclosure assembly 120. Purge gas introduced from the bottom of vacuum chamber 105 flows upward from the inlet port past the heater 145 and to an annular pumping channel 155. Vacuum system 115 which includes a vacuum pump (not shown), exhausts the gas (as indicated by arrows 160) through an exhaust line 165. The rate at which exhaust gases and entrained particles are drawn from the annular pumping channel 155 through the exhaust line 165 is controlled by a throttle valve system 170.

The temperature of the walls of deposition chamber 105 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Showerhead 130 also has heat exchanging passages. Typical heat-exchange fluids include water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 110.

Figure 2A:
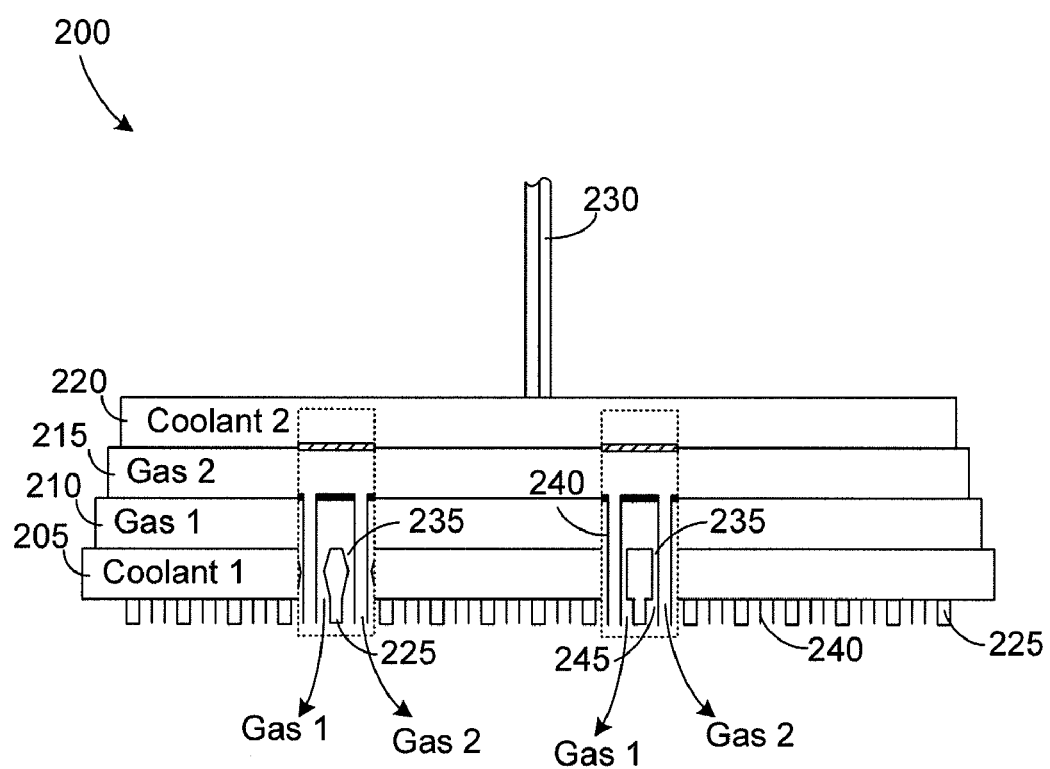
FIG. 2a is a simplified diagram of an exemplary showerhead, illustrating the basic structure of the showerhead in a partial cut-away view.
Figure 2B:
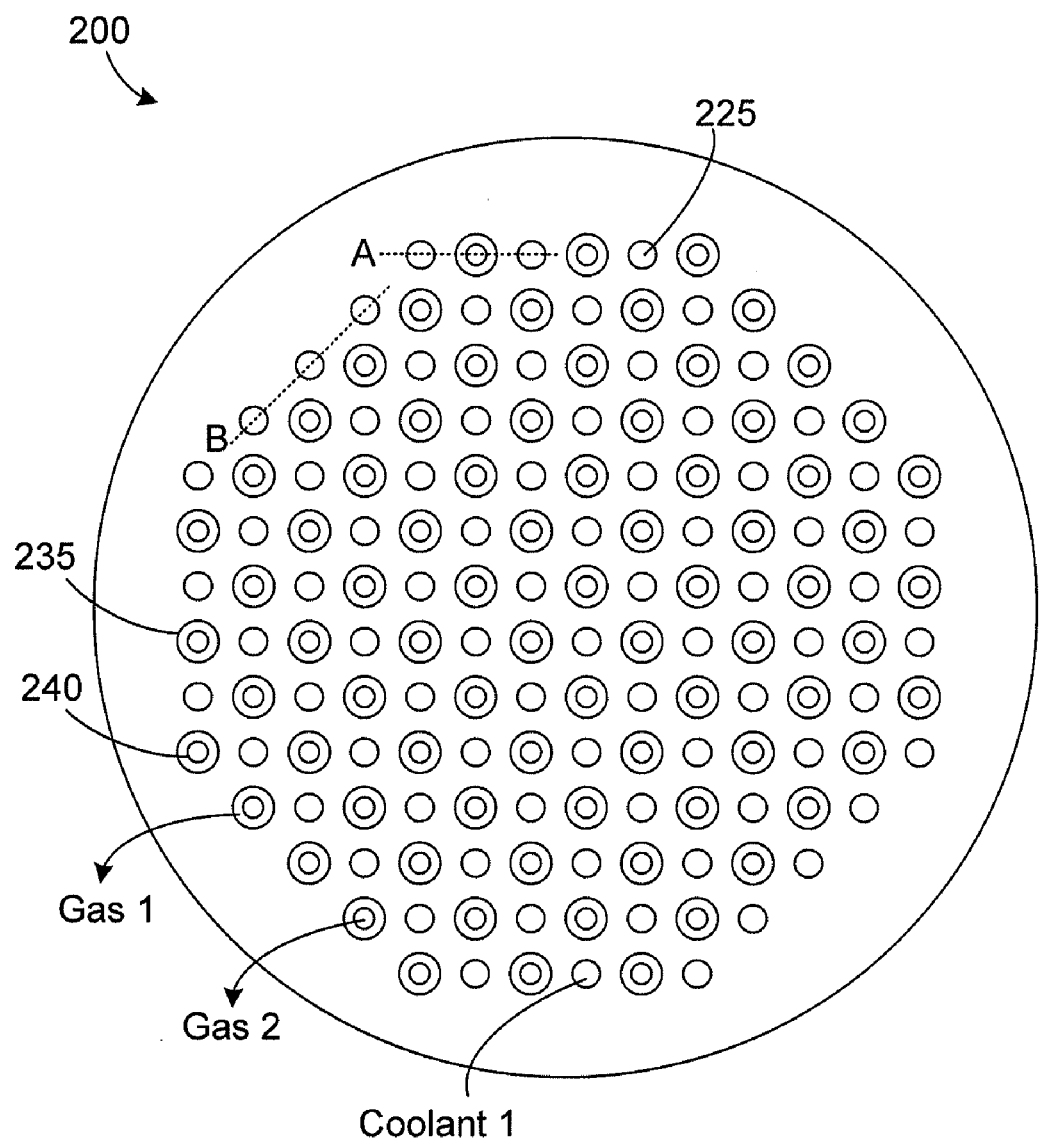
FIG. 2b is a simplified diagram of the exemplary showerhead shown in FIG. 2a, illustrating the basic structure of the showerhead surface in a planar view.
Figure 2C:
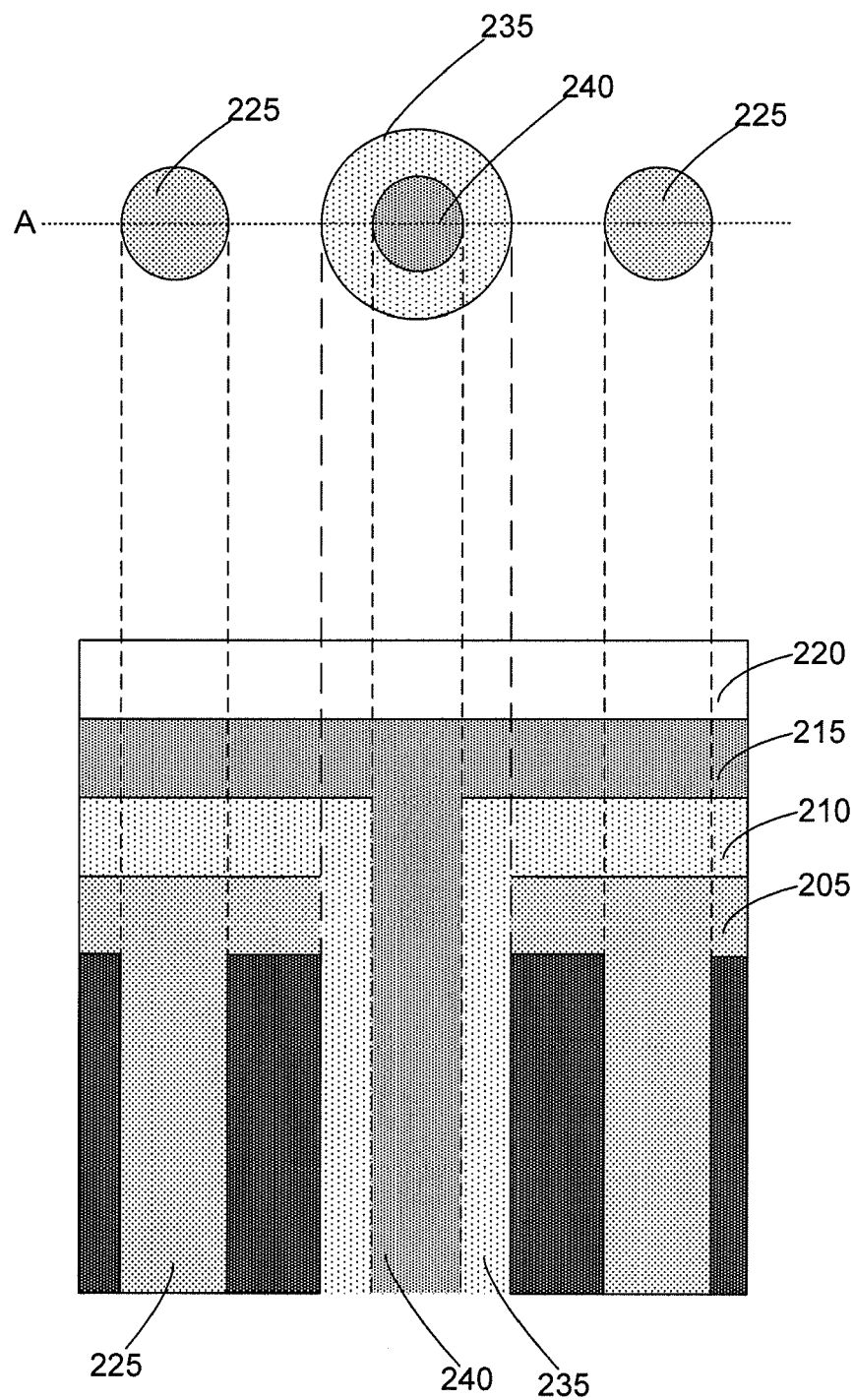
FIG. 2c is a cross-sectional view of the showerhead taken along line A shown in FIG. 2b.
Figure 2D:
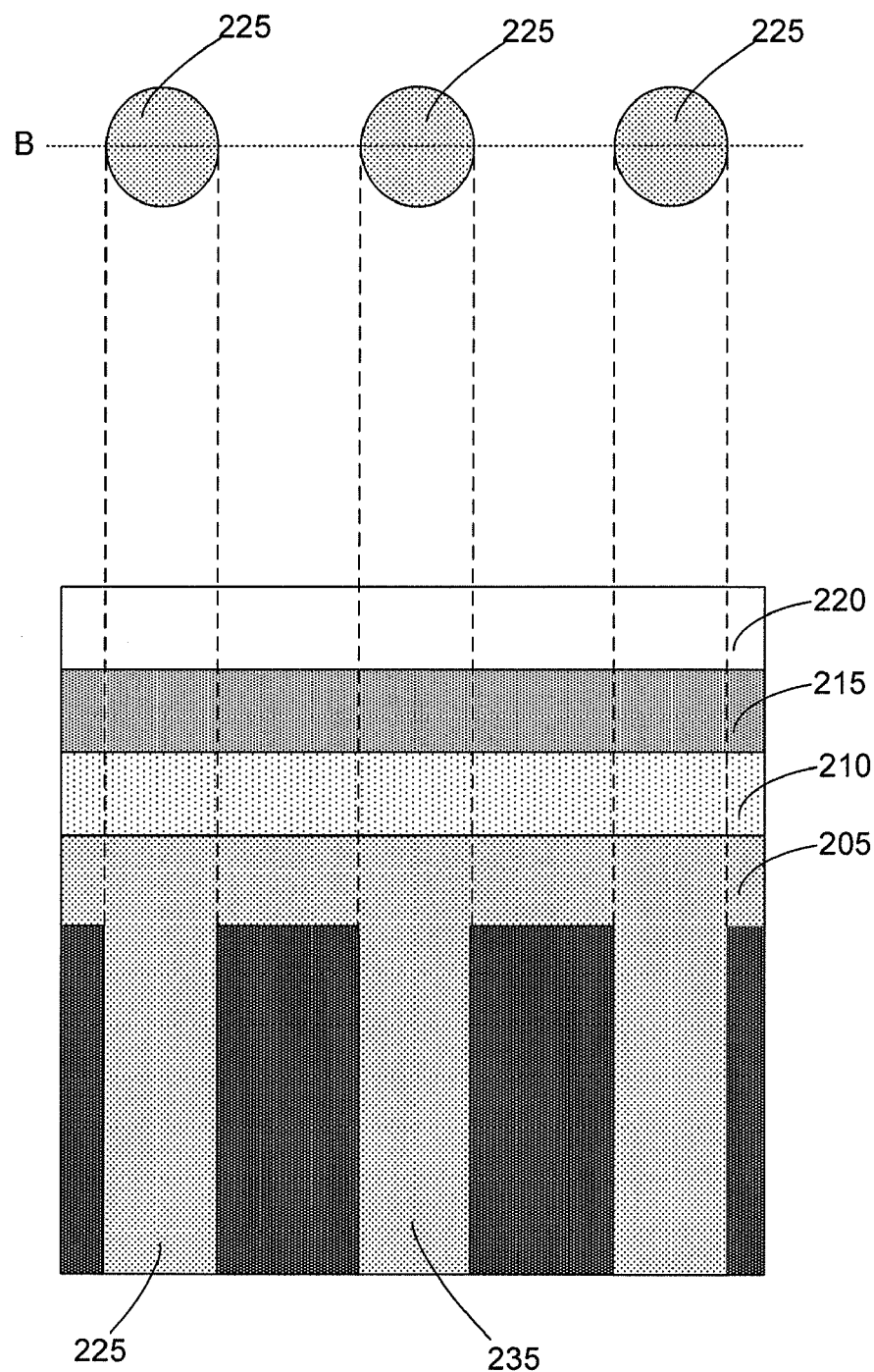
FIG. 2d is a cross-sectional view of the showerhead taken along line B shown in FIG. 2b.

FIG. 2a is a simplified diagram of an exemplary showerhead 200, illustrating the basic structure of the showerhead in a partial cut-away view. FIG. 2b is a simplified diagram of the exemplary showerhead shown in FIG. 2a, illustrating the basic structure of the showerhead surface in a planar view. FIG. 2c is a cross-sectional view of the showerhead taken along line A shown in FIG. 2b. FIG. 2d is a cross-sectional view of the showerhead taken along line B shown in FIG. 2b. The showerhead shown in FIGS. 2a-2d includes four internal plenums: a first coolant plenum 205, a first gas plenum 210, a second gas plenum 215, and a second coolant plenum 220.

The first coolant plenum 205 is provided near the surface of the showerhead 200 proximate the substrate surface on which a gaseous mixture is to be deposited (not shown). Tubes 225 extend from the first coolant plenum 205 into a processing chamber. In one embodiment, the first coolant plenum 205 contains coolant (e.g., Coolant 1) to control the temperature of gas in the first gas plenum 210. When the first coolant plenum 205 contains coolant, the tubes 225 are plugged to prevent the coolant from entering the chamber. In another embodiment, the first coolant plenum 205 is filled with a gas to be used in the substrate deposition process. The gas is provided by supply lines 230 that are connected to a gas delivery system. When the first coolant plenum 205 contains gas, the tubes 225 are not plugged to allow the gas to flow into the chamber. The proximity of the first coolant plenum 205 to the chamber causes the gas in the first coolant plenum 205 to be maintained at a temperature near the temperature of the chamber. Channels 235 are formed in a housing of the showerhead 200 such that the first gas plenum 210 is fluidicly coupled to the chamber. In one embodiment, the channels 235 have a constant diameter. In another embodiment the channels 235 have a varying diameter such that the channel surface has a conical or an hourglass shape.

The first gas plenum 210 is provided above the first coolant plenum 205. The channels 235 provided in the housing of the showerhead allow gas in the first gas plenum 210 (e.g., Gas 1) to flow into the chamber. When the first coolant plenum 205 contains coolant, gas from the first gas plenum 210 is cooled while entering the chamber. The second gas plenum 215 is provided above the first gas plenum 210. Tubes 240 extend from the second gas plenum 215 through the channels 235 in the housing and into the chamber to allow gas (e.g., Gas 2) in the second gas plenum 215 to flow into the chamber. The tubes 240 have a smaller diameter than the channels 235 to allow the gas in the first gas plenum 210 to flow into the chamber through an opening 245 defined between the outer surface of the tube 240 and the inner surface of the channel 235 in the housing.

The second coolant plenum 220 is optionally provided above the second gas plenum 215. In one embodiment, the second coolant plenum 220 contains coolant to control the temperature of the gas in the second gas plenum 215. In another embodiment, the second coolant plenum 220 may contain a gas to be dispensed into the chamber if the gas in the second gas plenum does not require temperature control. The gas in the second coolant plenum 220 may be dispensed into the chamber through tubes (not shown) as described in reference to the second gas plenum 215.

Figure 3:
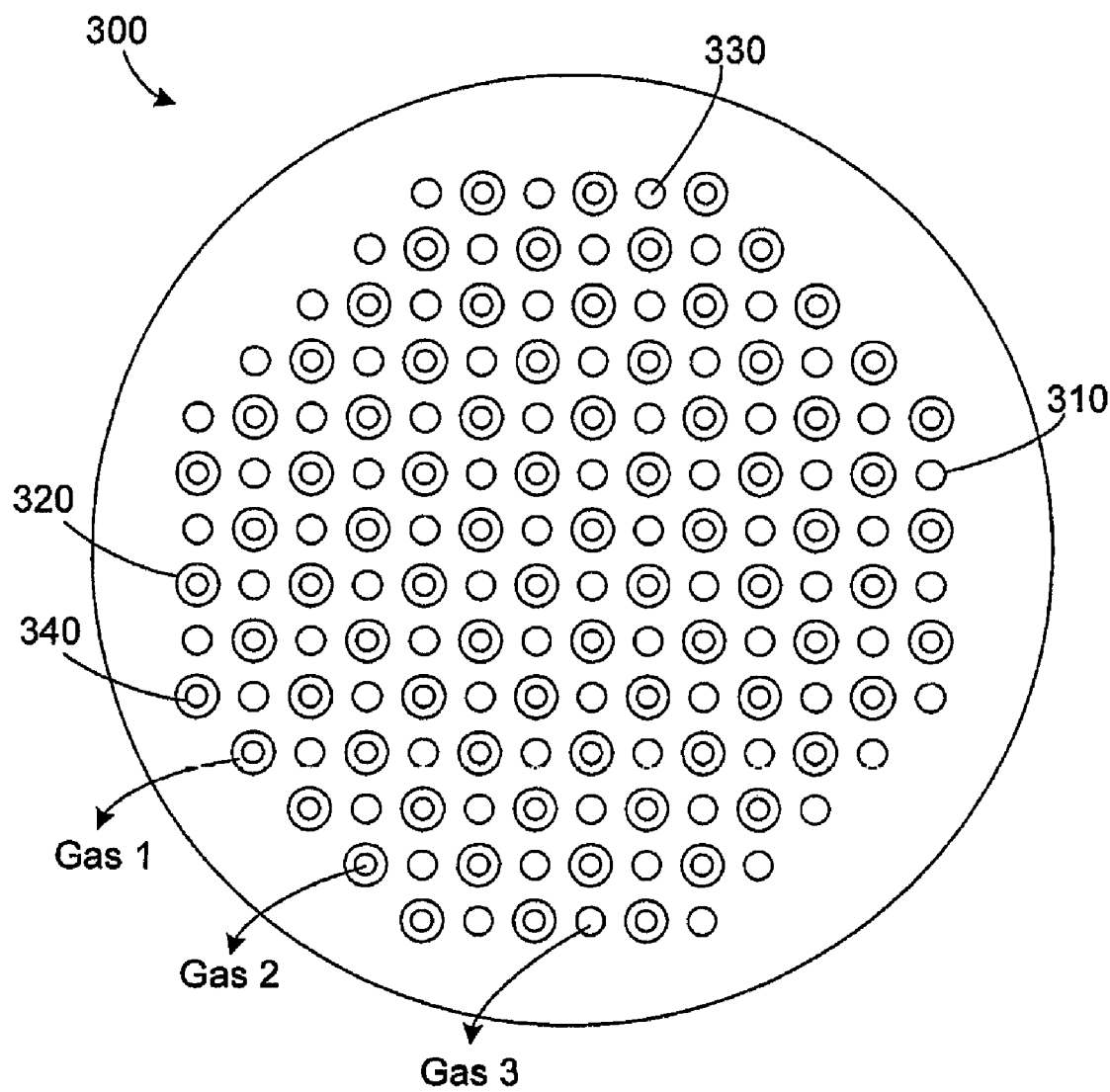
FIG. 3 is a simplified diagram of an exemplary showerhead, illustrating the basic structure of the showerhead surface in a planar view.

FIG. 3 is a simplified diagram of an exemplary showerhead 300, illustrating the basic structure of the showerhead surface in a planar view. The showerhead 300 includes holes 310 and channels 320 defined through a housing of the showerhead 300. In one embodiment, the holes 310 are smaller than the channels 320. Tubes 330 extend from the first coolant plenum of the showerhead 300 through the holes 310. The outer surface of the tubes 330 abut against the surface of the holes 310. In one embodiment, the first coolant plenum is filled with coolant and the tubes 330 are plugged such that no coolant flows into the chamber. In another embodiment, the tubes 330 are not plugged such that gas (e.g., Gas 3) contained in the first coolant plenum can flow into the chamber. Tubes 340 extend from the second gas plenum through the channels 320 such that gas (e.g., Gas 2) from the second gas plenum may flow into the chamber through the tubes 340. The tubes 340 do not abut against the surface of the channels 320 such that gas (e.g., Gas 1) from the first gas plenum may flow into the chamber in the space between the tube 340 and the surface of the channel 320. Thus, the channels 320 and the tubes 340 together form a concentric flow of gas from the first and second gas plenums of the showerhead into the chamber.

In one embodiment, the first coolant plenum and the second gas plenum each contain a precursor gas to be deposited on a substrate surface. In the case of highly volatile chemistries, it may be desirable to delay the mixing of the precursor gases until the gases are near the substrate surface. This may be accomplished by providing an inert gas in the first gas plenum. The inert gas flows through channels 320 and shields the precursor gas flowing through tubes 340. Thus, the mixing of the precursor gases is delayed until some length from the showerhead near the substrate surface. The delay in mixing may prevent the formation of adducts that may deposit on the showerhead surface causing particulates and changing the emissivity of the showerhead surface.

Figure 4A:
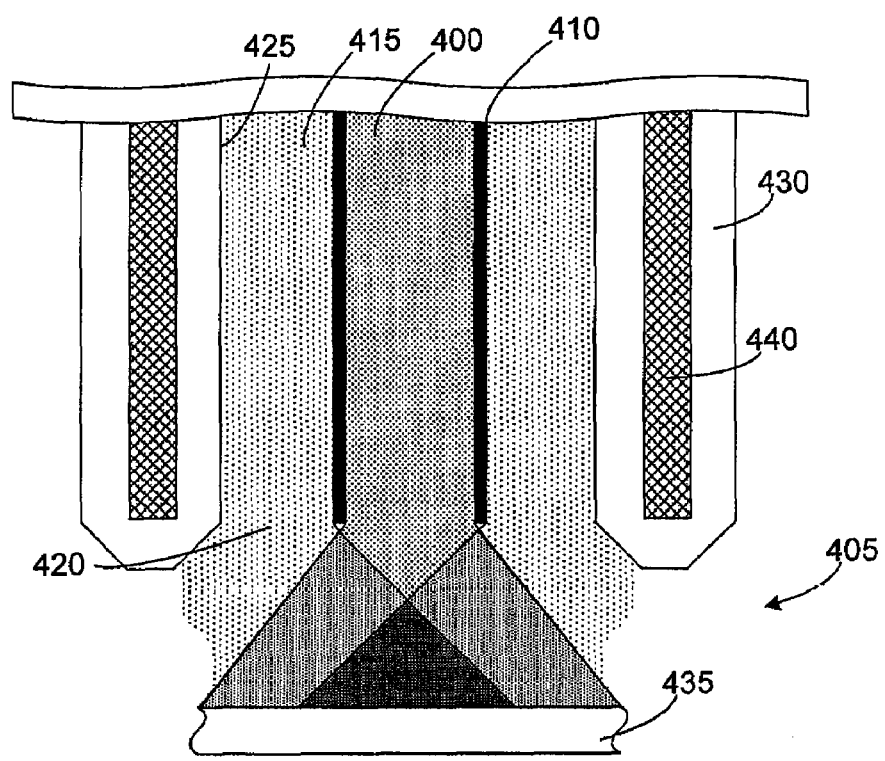
FIGS. 4a and 4b are simplified diagrams of an exemplary showerhead, illustrating the basic structure and function of the showerhead in a magnified, cut-away view.
Figure 4B:
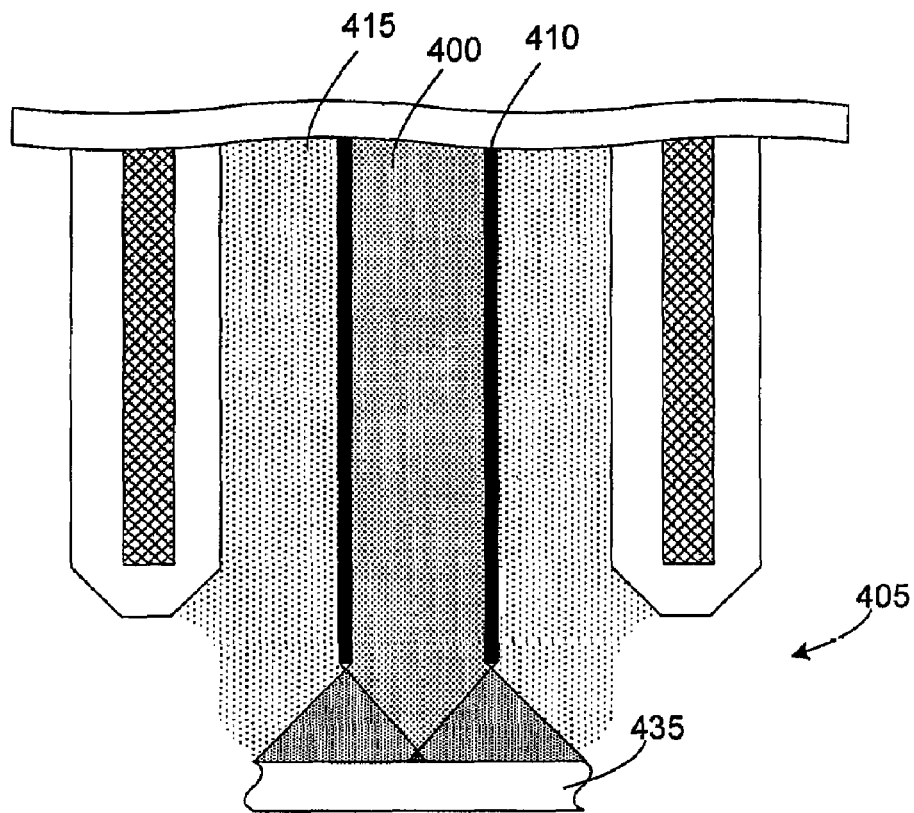

FIGS. 4a and 4b are simplified diagrams of an exemplary showerhead, illustrating the basic structure of the showerhead in a magnified, cut-away view. Referring to FIG. 4a, second plenum gas 400 enters the chamber 405 through tube 410. First plenum gas 415 enters the chamber 405 through an opening 420 defined between the outer surface of the tube 410 and the surface of a channel 425 defined in a housing of the showerhead. The gases enter the chamber 405 isolated from each other and begin mixing together within the chamber 405. The gaseous mixture may then be deposited onto the surface of substrate 435. In one embodiment, the first coolant plenum 430 contains a coolant 440. The coolant 440 is used to control the temperature of the first plenum gas 415.

The first plenum gas 415 and the second plenum gas 400 begin mixing when the second plenum gas 400 reaches the chamber 405 at the end of the tube 410. Thus, the length of the tube 410 extending into the chamber 405 determines the level of distribution of the first plenum gas 415 and the second plenum gas 400 in the gaseous mixture before the gaseous mixture is deposited onto the surface of the substrate 435. As shown in FIG. 4a, the length of the tube 410 is aligned with the opening 420 through which the first plenum gas 415 is dispensed into the chamber 405. This arrangement allows the first plenum gas 415 and the second plenum gas 400 to mix thoroughly such that the first plenum gas 415 and the second plenum gas 400 are substantially uniformly distributed before the gas mixture is deposited onto the surface of the substrate 435. The diameter of the tube 410 may be selected in accordance with the desired molar ratio of gases to be mixed in the chamber 405. For example, a tube having a large diameter (i.e., slightly less than the diameter of the channel 425) would allow more second plenum gas 400 into the chamber relative to the amount of first plenum gas 415. Likewise, a tube having a small diameter (i.e., significantly less than the diameter of the channel 425) would allow less second plenum gas 400 into the chamber relative to the amount of first plenum gas 415. In one embodiment, the diameter of the tube 410 is selected to allow substantially equal amounts of first plenum gas 415 and second plenum gas 400 to be dispensed into the chamber 405

Referring to FIG. 4b, the length of the tube 410 extending into the chamber 405 may be varied in relation to the surface of the substrate 435 based on the desired level of distribution of the first plenum gas 415 and the second plenum gas 400 in the gaseous mixture before the gaseous mixture is deposited onto the surface of the substrate 435. As shown in FIG. 4b, the length of the tube 410 is extended closer to the surface of the substrate 435 such that the second plenum gas 400 is deposited on the surface of the substrate 435 with less reaction with the first plenum gas 415. One having ordinary skill in the art would understand the selection of the length and diameter of the tube 410 determines the molar ratio of the gases mixed in the chamber 405 and the level of uniformity of the gaseous mixture before deposition on the surface of the substrate 435.

Figure 5:
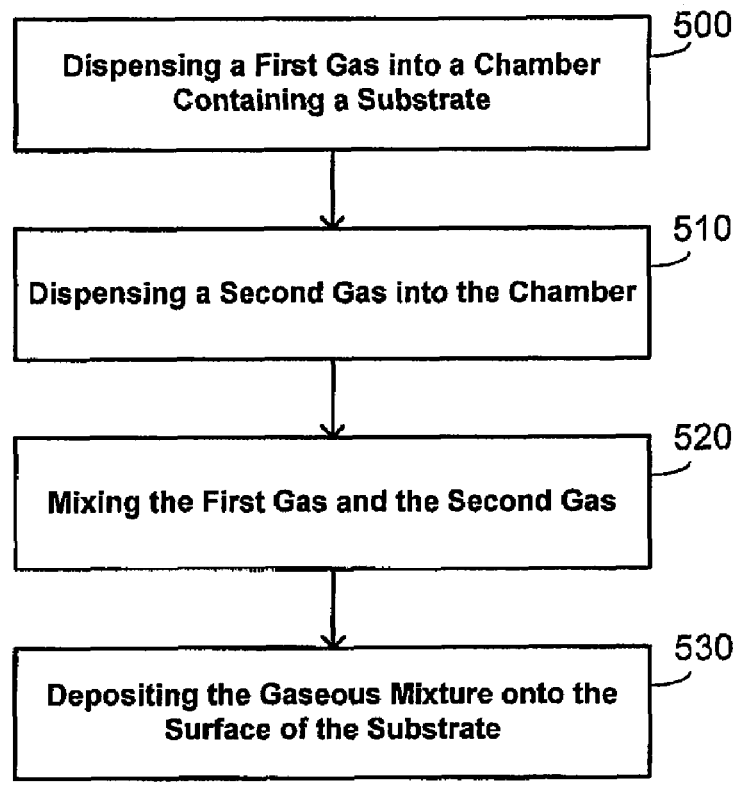
FIG. 5 is a flow diagram which summarizes a process for depositing a gaseous mixture onto a substrate surface using an exemplary showerhead.

An overview of embodiments of the invention is illustrated with the flow diagram of FIG. 5, which summarizes a process for depositing a gaseous mixture onto a substrate surface using a showerhead. The substrate is enclosed in a housing that forms a chamber around the substrate. The showerhead is positioned proximate the surface of the substrate such that gases dispensed from the showerhead and mixed in the chamber may be deposited onto the surface of the substrate.

A first gas that is contained in a first gas plenum of the showerhead is dispensed into the chamber at operation 500. The first gas is dispensed into the chamber through channels defined in a housing of the showerhead. In one embodiment, a coolant may be contained in a plenum of the showerhead that is proximate the first gas plenum and the chamber such that the temperature of the first gas is controlled by the coolant. Thus, the temperature of the first gas may be controlled as the first gas is dispensed into the chamber.

A second gas that is contained in a second gas plenum of the showerhead is dispensed into the chamber at operation 510. The second gas may be dispensed into the chamber at the same time that the first gas is dispensed into the chamber. The second gas is dispensed into the chamber through tubes that extend through the channels defined in the housing. The tubes do not abut against the surface of the channels such that the first gas may pass through a space defined between the outer surface of the tube and the surface of the channel. Thus, the diameter of the tube in relation to the diameter of the channel determines the molar ratio of the first gas and the second gas entering the chamber. The selectable diameter of the tube allows control over the molar ratio of gases when the gaseous mixture is deposited onto the surface of the substrate. In one embodiment, a coolant may be contained in a plenum of the showerhead that is proximate the second gas plenum such that the temperature of the second gas is controlled by the coolant. Thus, the temperature of the second gas may be controlled in the second gas plenum by the coolant.

The first gas and the second gas mix in the chamber at operation 520. The first gas and the second gas enter the chamber isolated from one another and do not begin mixing until the second gas exits the tube. The length of the tube extending into the chamber in relation to the surface of the substrate determines the level of distribution of the first and second gases in the gaseous mixture before the gaseous mixture is deposited onto the surface of the substrate. For example, if the length of the tube does not extend beyond the housing of the showerhead, the first gas and the second gas will be well-mixed (i.e., a substantially uniformly distributed gaseous mixture) before the gaseous mixture is deposited onto the surface of the substrate. In contrast, if the length of the tube extends beyond the housing of the showerhead such that the opening of the tube is proximate the surface of the substrate, the first gas and the second gas will not be well-mixed before the gases are deposited onto the surface of the substrate. The selectable length of the tube allows control over the level of distribution of gases when the gaseous mixture is deposited onto the surface of the substrate. The mixture of the first gas and the second gas is then deposited onto the surface of the substrate at operation 530.

The individual steps illustrated by this figure may include multiple sub-steps that may be performed in various sequences as appropriate to the individual step. Furthermore, other alternatives can also be provided where steps are added, one or more steps are removed, or one or more steps are provided in a different sequence without departing from the scope of the claims herein. One of ordinary skill in the art would recognize many variations, modifications, and alternatives.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A system for depositing a gaseous mixture onto a surface of a substrate, comprising:
 a housing defining a processing chamber;
 a substrate holder disposed within the processing chamber;
 a first gas source;

a second gas source;
a first coolant source;
a second coolant source; and
a CVD showerhead disposed over the substrate holder, the CVD showerhead comprising:
  a first plenum fluidicly coupled with the first gas source and having a plurality of channels fluidicly coupled with an interior of the processing chamber;
  a second plenum fluidicly coupled with the second gas source;
  a third plenum fluidicly coupled with the first coolant source and positioned below the first plenum and above an interior of the processing chamber, wherein the first coolant controls the temperature of the first gas in the first plenum;
  a fourth plenum fluidicly coupled with the second coolant source and positioned above the second plenum, wherein the second coolant controls the temperature of the second gas in the second plenum; and
  a plurality of tubes extending from the second plenum through the channels and into the interior of the processing chamber, wherein the diameter of the tubes is smaller than the diameter of the channels such that the second gas flows into the interior of the processing chamber through the tubes and the first gas flows into the interior of the processing chamber through a space defined between the outer surface of the tubes and the surface of the channels,
  wherein the first coolant controls the temperature of the first gas when the first gas enters the interior of the processing chamber.

2. The system recited in claim 1 wherein the diameter of the tubes extending into the interior of the processing chamber determines the molar ratio of the first gas and the second gas in the gaseous mixture that is deposited on the surface of the substrate positioned on the substrate holder.

3. The system recited in claim 1 wherein at least one of the channels has a varying diameter.

4. The system recited in claim 1 wherein the gaseous mixture comprising the first gas and the second gas does not begin forming until the second gas exits the tubes and enters the interior of the processing chamber.

5. The system recited in claim 1 wherein the first gas and the second gas enter the interior of the chamber isolated from each other.

* * * * *